United States Patent
Shiang et al.

(10) Patent No.: US 7,973,126 B2
(45) Date of Patent: *Jul. 5, 2011

(54) EMISSIVE POLYMERIC MATERIALS FOR OPTOELECTRONIC DEVICES

(75) Inventors: Joseph John Shiang, Niskayuna, NY (US); Kelly Scott Chichak, Clifton Park, NY (US); James Anthony Cella, Clifton Park, NY (US); Larry Neil Lewis, Scotia, NY (US); Kevin Henry Janora, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 669 days.
This patent is subject to a terminal disclaimer.

(21) Appl. No.: 11/957,579

(22) Filed: Dec. 17, 2007

(65) Prior Publication Data
US 2009/0156783 A1  Jun. 18, 2009

(51) Int. Cl.
C08G 79/00 (2006.01)
H01L 51/54 (2006.01)
C09K 11/06 (2006.01)

(52) U.S. Cl. ............ 528/395; 528/9; 528/394; 528/397; 528/423; 528/425; 526/241; 526/258; 428/690; 428/917; 313/504; 313/506; 257/40; 257/E51.032; 257/E51.044; 252/301.35

(58) Field of Classification Search ............... 528/9, 394, 528/395, 397, 422, 423, 425; 526/241, 258; 428/690, 917; 313/504, 506; 257/40, E51.032, 257/E51.044; 252/301.35
See application file for complete search history.

(56) References Cited

U.S. PATENT DOCUMENTS

| | | | |
|---|---|---|---|
| 3,995,299 | A | 11/1976 | Partridge |
| 6,097,147 | A | 8/2000 | Baldo et al. |
| 6,303,238 | B1 | 10/2001 | Thompson et al. |
| 6,815,091 | B2 | 11/2004 | Takiguchi et al. |
| 6,830,828 | B2 | 12/2004 | Thompson et al. |
| 6,921,915 | B2 | 7/2005 | Takiguchi et al. |
| 6,946,688 | B2 | 9/2005 | Grushin et al. |
| 6,989,273 | B2 | 1/2006 | Hsieh et al. |
| 7,691,292 | B2 * | 4/2010 | Chichak et al. ......... 252/301.16 |
| 7,691,494 | B2 * | 4/2010 | Chichak et al. ............... 428/690 |
| 7,695,640 | B2 * | 4/2010 | Chichak et al. ......... 252/301.35 |
| 7,704,610 | B2 * | 4/2010 | Chichak et al. ............... 428/690 |
| 7,718,087 | B2 * | 5/2010 | Chichak et al. ......... 252/301.35 |
| 7,718,277 | B2 * | 5/2010 | Chichak et al. ............... 428/690 |
| 2003/0096138 | A1 | 5/2003 | Lecloux et al. |
| 2004/0197600 | A1 | 10/2004 | Thompson et al. |

FOREIGN PATENT DOCUMENTS

| | | |
|---|---|---|
| EP | 1834956 A1 | 9/2007 |
| JP | 09164772 | 6/1997 |
| WO | WO03001616 A2 | 1/2003 |
| WO | WO2004085450 A2 | 10/2004 |
| WO | WO2006073112 A1 | 12/2007 |

OTHER PUBLICATIONS

Co-pending US Patent Application, entitled Electronic Devices Comprising Organic Iridium Compositions, U.S. Appl. No. 11/504,870, filed Aug. 16, 2006.
Co-pending US Patent Application, entitled Ketopyrroles Useful as Ligands in Organic Iridium Compositions, U.S. Appl. No. 11/504,084, filed Aug. 14, 2006.

(Continued)

*Primary Examiner* — Duc Truong
(74) *Attorney, Agent, or Firm* — Mary Louise Gioeni

(57) ABSTRACT

Polymers including at least one structural unit derived from a compound of formula I or including at least one pendant group of formula II may be used in optoelectronic devices

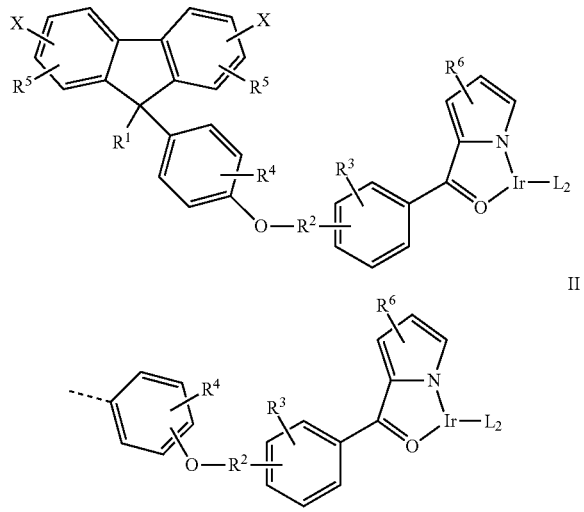

wherein $R^1$, $R^3$, $R^4$ and $R^6$ are independently hydrogen, alkyl, alkoxy, oxaalkyl, alkylaryl, aryl, arylalkyl, heteroaryl, substituted alkyl; substituted alkoxy, substituted oxaalkyl, substituted alkylaryl, substituted aryl, substituted arylalkyl, or substituted heteroaryl;

$R^{1a}$ is hydrogen or alkyl;

$R^2$ is alkylene, substituted alkylene, oxaalkylene, CO, or $CO_2$;

$R^{2a}$ is alkylene;

$R^5$ is independently at each occurrence hydrogen, alkyl, alkylaryl, aryl, arylalkyl, alkoxy, carboxy, substituted alkyl; substituted alkylaryl, substituted aryl, substituted arylalkyl, or substituted alkoxy, X is halo, triflate, $-B(OR^{1a})_2$, or

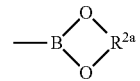

located at the 2, 5- or 2, 7-positions; and L is derived from phenylpyridine, tolylpyridine, benzothienylpyridine, phenylisoquinoline, dibenzoquinozaline, fluorenylpyridine, ketopyrrole, 2-(1-naphthyl)benzoxazole)), 2-phenylbenzoxazole, 2-phenylbenzothiazole, coumarin, thienylpyridine, phenylpyridine, benzothienylpyridine, 3-methoxy-2-phenylpyridine, thienylpyridine, phenylimine, vinylpyridine, pyridylnaphthalene, pyridylpyrrole, pyridylimidazole, phenylindole, derivatives thereof or combinations thereof.

17 Claims, No Drawings

OTHER PUBLICATIONS

Co-pending US Patent Application, entitled Emissive Polymeric Materials for Optoelectronic Devices, U.S. Appl. No. 11/957,566, filed Dec. 17, 2007.

Tsuboyama et al., "Homoleptic Cyclometalated Iridium Complexes With Highly Efficient Red Phosphorescence and Application to Organic Light-Emitting Diode", J. Am. Chem. Soc., vol. 125, pp. 12971-12979, 2003.

Su et al., "Highly Efficient Red Electrophosphorescent Devices Based on Iridium Isoquinoline Complexes: Remarkable External Quantum Efficiency Over a Wide Range of Current", Advanced Materials, vol. 15, No. 11, pp. 884-888, Jun. 5, 2003.

Zhu et al., "Synthesis and Red Electrophosphorescence of a Novel Cyclometalated Iridium Complex in Polymer Light-Emitting Diodes", Thin Solid Films, vol. 446, pp. 128-131, 2004.

Huang et al., "Bright Red Electroluminescent Devices Using Novel Second-Ligand-Contained Europium Complexes as Emitting Layers", J. Mater. Chem., vol. 11, pp. 790-793, 2001.

Ahachi et al., "Nearly 100% Internal Phosphorescence Efficiency in an Organic Light Emitting Device", Journal of Applied Physics, vol. 90, No. 10, pp. 5048-5051, Nov. 15, 2001.

Baldo et al., "Very High-Efficiency Green Organic Light-Emitting Devices Based on Electrophosphorescence", Applied Physics Letters, vol. 75, No. 1, pp. 4-6, Jul. 5, 1999.

Li et al., "Synthetic Control of Excited-State Properties in Cyclometalated Ir(III) Compleexes Using Ancillary Ligands", Inorganic Chemistry, vol. 44, pp. 1713-1727, 2005.

You et al., "Inter-Ligand Energy Transfer and Related Emission Change in the Cyclometalated Heteroleptic Iridium Complex: Facile and Efficient Color Tuning Over the Whole Visible Range by the Ancillary Ligand Structure", J. Am. Chem. Soc., vol. 127, No. 36, pp. 12438-12439, 2005.

Sandee et al., "Solution-Processible Conjugated Electrophosphorescent Polymers", J. Am. Chem. Soc., vol. 126, pp. 7041-7048, 2004.

Friend et al., "Electroluminescence in Conjugated Polymers", Nature, vol. 397, pp. 121-128, Jan. 14, 1999.

Forrest, Active Optoelectronics Using Thin-Film Organic Semiconductors, IEEE Journal on Selected Topices in Quantum Electronics, vol. 6, No. 6, pp. 1072-1083, 2000.

Baldo et al., "Highly Efficient Phosphorescent Emission From Organic Electroluminescent Devices", Nature, vol. 395, pp. 151-154, teptember 10, 1998.

Wang et al., "Novel Iridium Complex and Its Copolymer With N-Vinyl Carbazole for Electroluminescent Devices", IEEE Journal on Selected Topices in Quantum Electronics, vol. 10, No. 1, pp. 121-126, 2004.

Co-pending US Patent Application, entitled "Organic Iridium Compositions and Their Use in Electronic Devices", U.S. Appl. No. 11/504,871, filed Aug. 16, 2006.

Co-pending US Patent Application, entitled "Electronic Devices Comprising Organic Iridium Compositions", U.S. Appl. No. 11/506,002, filed Aug. 17, 2006.

Co-pending US Patent Application, entitled "Organic Iridium Compositions and Their Use in Electronic Devices", U.S. Appl. No. 11/506,001, filed Aug. 17, 2006.

Co-pending US Patent Application, entitled "Electronic Devices Comprising Organic Iridium Compositions", U.S. Appl. No. 11/507,051, filed Aug. 18, 2006.

Co-pending US Patent Application, entitled "Method for Preparing Polymeric Organic Iridium Compositions", U.S. Appl. No. 11/599,972, filed Nov. 15, 2006.

Co-pending US Patent Application, entitled "Method of Making Organic Light Emitting Devices", U.S. Appl. No. 11/637,582, filed Dec. 12, 2006.

Co-pending US Patent Application, entitled "Organic Iridium Compositions and Their Use in Electronic Devices", U.S. Appl. No. 11/504,552, filed Aug. 14, 2006.

Cao et al., "Efficient, Fast Response Light-Emitting Electrochemical Cells: Electroluminescent and Solid Electrolyte Polymers With Interpenetrating Network Morphology", Appl. Phys. Lett., vol. 68, No. 23, pp. 3218-3220, Jun. 3, 1996.

Sprouse et al., Photophysical Effects of Metal-Carbon σ Bonds in Ortho-Metalated Complexes of Ir(III) and Rh(III), J. Am. Chem. Soc., vol. 106, pp. 6647-6653, 1984.

King et al., "Efficient-State Properties of a Triply Ortho-Metalated Iridium(III) Complex", J. Am. Chem. Soc., vol. 107, pp. 1431-1432, 1985.

Kim et al., "Efficient Electrogenerated Chemiluminescence From Cyclometalated Iridium(III)Complexes", J. Am. Chem. Soc., vol. 127, No. 6, pp. 1614-1615, 2005.

Jiang et al., "High-Efficiency Electrophosphorescent Fluorene-alt-carbazole Copolymers N-Grafted With Cyclometalated Ir Complexes", Macromolecules, vol. 38, pp. 4072-4080, 2005.

Yang et al., "Synthesis of a High-Efficiency Red Phosphorescent Emitter for Organic Light-Emitting Diodes", J. Mater., Chem., vol. 14, pp. 947-950, 2004.

Lamansky et al., "Highly Phosphorescent Bis-Cyclometalated Iridium Complexes: Synthesis, Photophysical Characterization, and Use in Organic Light Emitting Diodes", J. Am. Chem. Soc., vol. 123, pp. 4304-4312, 2001.

Lamansky et al., Synthesis and Characterization of Phosphorescent Cyclometalated Iridium Complexes:, Inorg. Chem., vol. 40, pp. 1704-1711, 2001.

Colombo et al., "Facial Tris Cyclometalated Rh3+ and Ir3+ Complexes: Their Synthesis, Structure, and Optical Spectroscopic Properties", Inorg. Chem. vol. 33, pp. 545-550, 1994.

Thomas et al., "Efficient Red-Emitting Cyclometalated Iridium(III) Complexes Containing Lepidine-Based Ligands", Inorganic Chemistry, vol. 44, No. 16, pp. 5677-5685, 2005.

Holder et al., "New Trends in the Use of Transition Metal-Ligand Complexes for Applications in Electroluminescent Devices", Advances Materials, vol. 17, pp. 1109-1121, 2005.

Wong et al., "A Multifunctional Platinum-Based Triplet Emitter for OLED Applications#", Organometallics, vol. 24, pp. 4079-4082, 2005.

Wang et al., "Electrophosphorescence from Substituted Poly(thiophene) Dopes with Iridium of Platinum Complex", Thin Solid Films, vol. 468, pp. 226-233, 2004.

Jiang et al., "High-Efficiency, Saturated Red-Phosphorescent Polymer Light-Emitting Diodes Based on Conjugated and Non-Conjugated Polymers Doped with an Ir Complex", Advanced Materials, vol. 16, No. 6, pp. 537-541, 2004.

Nam et al., "A Synthesis and Luminescence Study of Ir(ppz)3 for Organic Light-Emitting Devices", The Chemical Society of Japan, Bull. Chem. Soc. Jpn., vol. 77, No. 4, pp. 751-755, 2004.

* cited by examiner

EMISSIVE POLYMERIC MATERIALS FOR OPTOELECTRONIC DEVICES

STATEMENT REGARDING FEDERALLY SPONSORED RESEARCH AND DEVELOPMENT

This invention was made with Government support under contract number DOE NETL DE-FC26-05NT42343 awarded by the U.S. Department of Energy. The Government may have certain rights in the invention.

CROSS-REFERENCE TO RELATED APPLICATIONS

This application is related to U.S. patent application Ser. No. 11/957,566 entitled EMISSIVE POLYMERIC MATERIALS FOR OPTOELECTRONIC DEVICES.

BACKGROUND

The invention relates to polymers having pendant iridium complexes for use in optoelectronic devices.

Organic light emitting devices (OLEDs), which make use of thin film organic materials that emit light when subjected to a voltage bias, are expected to become an increasingly popular form of flat panel display technology. Potential applications include cellphones, personal digital assistants (PDAs), computer displays, informational displays in vehicles, television monitors, as well as light sources for general illumination. Due to their bright colors, wide viewing angle, compatibility with full motion video, broad temperature ranges, thin and conformable form factor, low power requirements and the potential for low cost manufacturing processes, OLEDs are seen as a future replacement technology for cathode ray tubes (CRTs) and liquid crystal displays (LCDs). Due to their high luminous efficiencies, OLEDs may replace incandescent, and perhaps even fluorescent, lamps for certain types of applications.

Light emission from OLEDs typically occurs via electrofluorescence, i.e. light emission from a singlet excited state formed by applying a voltage bias across a ground state electroluminescent material. It is believed that OLEDs capable of producing light by an alternate mechanism, electrophosphorescence, i.e. light emission from a triplet excited state formed by applying a voltage bias across a ground state electrofluorescecent material, will exhibit substantially higher quantum efficiencies than OLEDs that produce light primarily by electrofluorescence. Light emission from OLEDs by electrophosphorescence is limited since the triplet excited states in most light emitting organic materials are strongly disposed to non-radiative relaxation to the ground state. Thus, electrophosphorescent materials hold promise as key components of OLED devices and other optoelectronic devices exhibiting greater efficiencies relative to the current state of the art. For example, OLEDs capable of light production by electrophosphorescence are expected to exhibit a reduction (relative to OLEDs which produce light primarily by electrofluorescence) in the amount of energy lost to radiationless decay processes within the device thereby providing an additional measure of temperature control during operation of the OLED.

Improved light emission efficiencies have been achieved by incorporating a phosphorescent platinum-containing dye in an organic electroluminescent device such as an OLED (Baldo et al., "Highly Efficient Phosphorescent Emission from Organic Electroluminescent Devices", Nature, vol. 395, 151-154, 1998) and phosphorescent iridium-containing dyes have also been employed (US 2003/0096138). Polymerizable phosphorescent iridium complexes based on a ketopyrrole ligand are disclosed in pending U.S. application Ser. No. 11/504,552, filed on 14 Aug. 2006, which claims priority from U.S. provisional application Ser. No. 60/833,935, filed on 28 Jul. 2006, the entire contents of which are incorporated by reference in their entirety. Notwithstanding earlier developments, there is currently considerable interest in finding novel phosphorescent materials which increase efficiency and provide for a greater measure of control of the color of light produced by an OLED, while achieving improved lifetime of the devices.

BRIEF DESCRIPTION

It has been discovered that changes in the emissive properties of the Iridium (III) dyes resulting from conjugative effects in the solid state may be prevented by separating the Iridium dyes from the backbone of the polymer as pendant side-chain substituents. Accordingly, in one aspect, the present invention relates to compounds of formula I, and polymers comprising at least one structural unit derived therefrom

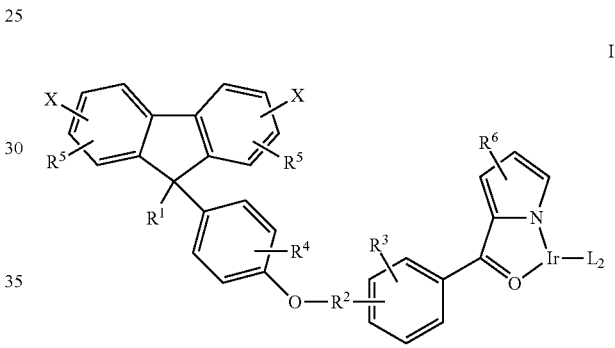

I wherein
$R^1$, $R^3$, $R^4$ and $R^6$ are independently hydrogen, alkyl, alkoxy, oxaalkyl, alkylaryl, aryl, arylalkyl, heteroaryl, substituted alkyl; substituted alkoxy, substituted oxaalkyl, substituted alkylaryl, substituted aryl, substituted arylalkyl, or substituted heteroaryl;
$R^{1a}$ is hydrogen or alkyl;
$R^2$ is alkylene, substituted alkylene, oxaalkylene, CO, or $CO_2$;
$R^{2a}$ is alkylene;
$R^5$ is independently at each occurrence hydrogen, alkyl, alkylaryl, aryl, arylalkyl, alkoxy, carboxy, substituted alkyl; substituted alkylaryl, substituted aryl, substituted arylalkyl, or substituted alkoxy,
X is halo, triflate, —$B(OR^{1a})_2$, or

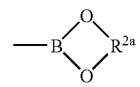

located at the 2, 5- or 2, 7-positions; and
L is derived from phenylpyridine, tolylpyridine, benzothienylpyridine, phenylisoquinoline, dibenzoquinozaline, fluorenylpyridine, ketopyrrole, 2-(1-naphthyl)benzoxazole)), 2-phenylbenzoxazole, 2-phenylbenzothiazole, coumarin, thienylpyridine, phenylpyridine, benzothienylpyridine, 3-methoxy-2- phenylpyridine, thienylpyridine, phenylimine, vinylpyridine, pyridylnaphthalene, pyridylpyrrole, pyridylimidazole, phenylindole, derivatives thereof or combinations thereof.

In another aspect, the present invention relates to polymers comprising at least one pendant group of formula II

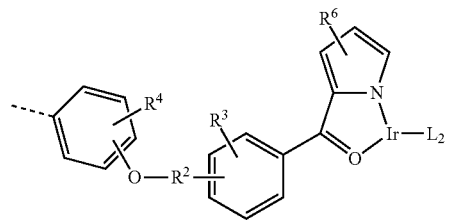

wherein $R^2$, $R^3$, $R^4$, $R^6$ and L are as defined for formula I.

In yet another aspect, the present invention relates to optoelectronic devices comprising a polymer having at least one structural unit derived from a compound of formula I, or a polymer having at least one pendant group of formula II.

DETAILED DESCRIPTION

The present invention relates to compounds of formula I, polymers derived from these compounds, polymers having pendant groups of formula II, and optoelectronic devices containing the polymers in one or more light emissive layers.

Structural units or the pendant groups may be derived from a fluorene or triarylamine compound. Examples of structural units derived from fluorene monomers containing a pendant Ir complex include

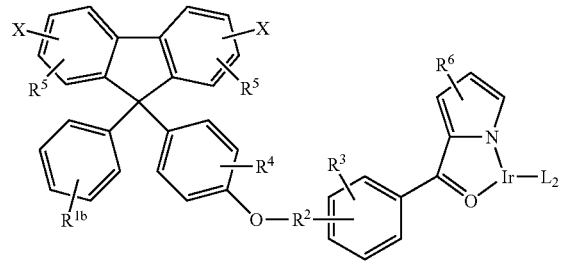

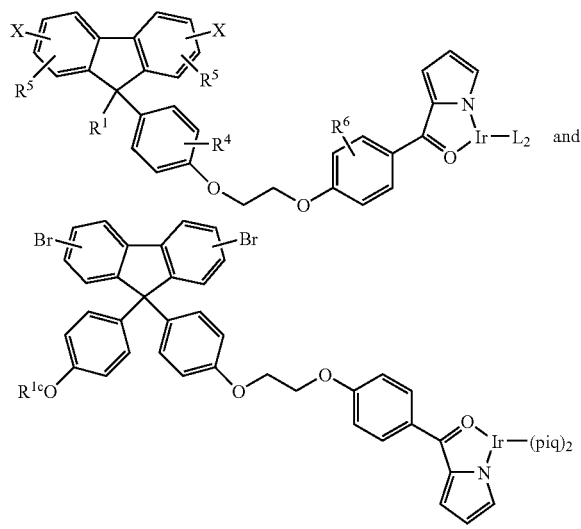

wherein $R^{1b}$ is hydrogen, alkyl, alkoxy, oxaalkyl, substituted alkyl; substituted alkoxy, or substituted oxaalkyl; and $R^{1c}$ is hydrogen, alkyl, or substituted alkyl.

In many embodiments, $R^2$ is preferably oxaalkylene, particularly —CH$_2$CH$_2$O—.

Examples of triarylamine monomers containing a pendant Ir complex include

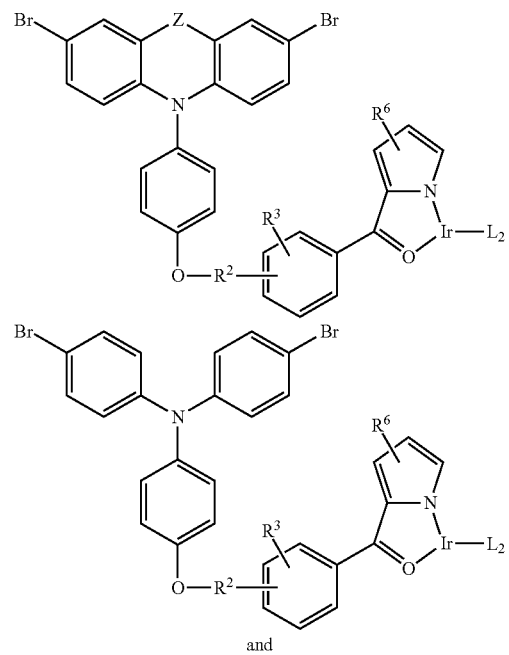

and

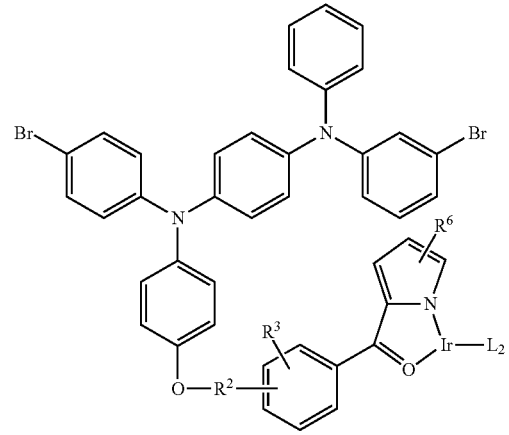

wherein Z is O, S, or a direct bond.

Polymers derived from compounds of formula I or having pendant groups of formula II may additionally include structural units derived from other monomers, particularly fluorene monomers, such as those described in U.S. Pat. Nos. 5,929,194, 5,948,552, 6,204,515, 6,605,373, 6,815,505, and 6,916,902, to Dow. More particularly, the structural units may be derived from a dibromo 9, 9-dioctyl fluorene monomer. The polymers may include structural units derived from at least one triarylamine monomer, in particular TFB, in addition to or instead of those derived from fluorene monomers. Suitable triarylamine monomers and polymers containing residues derived from these and fluorene monomers are described in U.S. Pat. Nos. 5,708,130, 6,169,163, 6,353,083, 6,255,447, 6,255,449, and 6,900,285, also to Dow. For example, in addition to residues containing an iridium complex, the polymers may include structural units of formula III

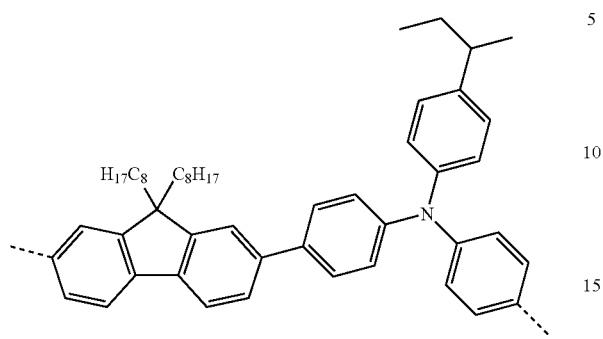

In particular, the polymers may include structural units of formula IV

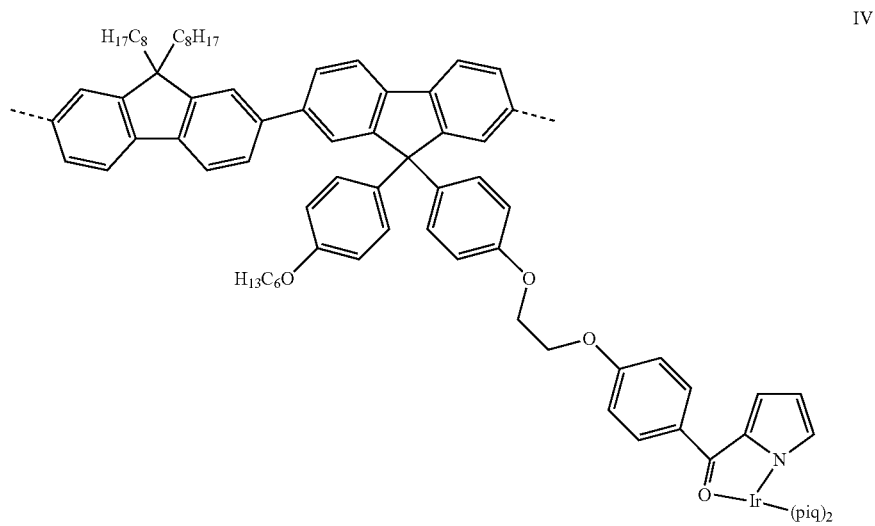

wherein piq is phenylsoquinolinyl. More particularly, the polymers may contain about 95% of the structural units of formula III and 5% of the structural units of formula IV, as shown below

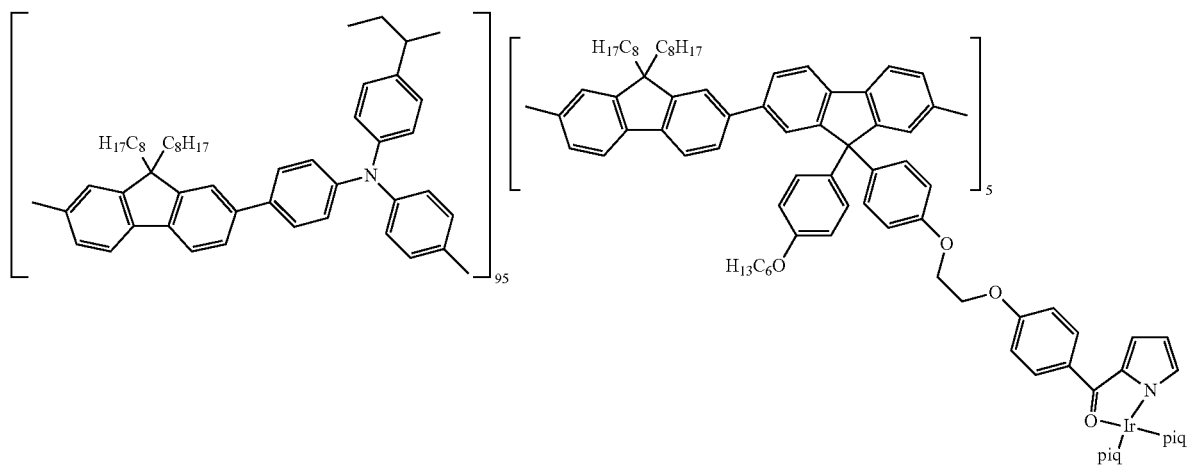

wherein piq is phenylsoquinolinyl.

In some embodiments, the pendant groups of formula II are of formula

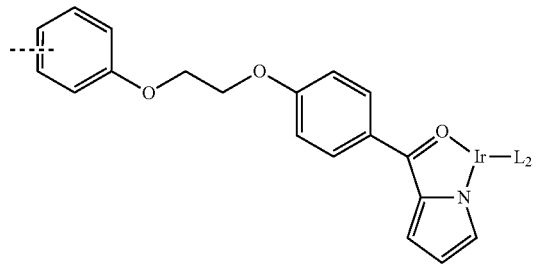

In some of these embodiments, L is phenylisoquinolinyl (piq).

The structural units derived from the compounds of formula I or the pendant groups of formula II may be present in the polymer in an amount ranging from about 0.01 percent to about 50 percent by weight of the polymer, particularly in an amount ranging from about 0.1 percent to about 10 percent by weight, and more particularly, from about 0.5 percent to about 5 percent by weight. The polymers typically have a number average molecular weight (Mn) greater than 2,000 grams per mole as determined by gel permeation chromatography, particularly greater than about 5,000 grams per mole greater than about 15,000 grams per mole, and more particularly, greater than about 25,000 grams per mole as determined by gel permeation chromatography.

Optoelectronic devices according to the present invention include at least one polymer derived from compounds of formula I or having pendant groups of formula II. The polymers may be blended with fluorescent emitting materials such as (co)polymers based on fluorene monomers, for example, F8-TFB, commercially available emissive polymers such as ADS131 BE, ADS231 BE, ADS331 BE, ADS431 BE, ADS429BE, ADS160BE, ADS329BE, ADS229BE, ADS129BE, ADS180BE, supplier by American Dye Sources, and BP105 and BP361, available from Sumation Company Ltd. Other materials useful for blending with the polymers of the present invention include molecular and oligomeric species such as fluorene trimers and their derivatives, polymeric or molecular triarylamine materials, including those described in U.S. Pat. Nos. 3,265,496 and 4,539,507, and commercially available triarylamines available from American Dye Sources, such as ADS254BE, ADS12HTM, and ADS04HTM, substituted polyphenylene polymers, such ADS120BE from American Dye Sources, and polymers having oligomeric units connected via non-conjugated linking groups, as described in US 2005/0256290.

It is preferable that when blending the polymers of the present invention with other materials, that the lowest triplet energy level of the other materials (as measured by photoluminescence or other technique) be greater that the triplet energy of the pendent Iridium-based emitter of the polymers of the present invention. In particular, polymers may be blended with one or more fluorescent materials such as blue-emitting fluorene (co)polymers, as these typically have a lowest triplet energy below that of the lowest emissive single energy of the polymers of the present invention and exhibit blue emission.

The polymers of the present invention and/or blends of the polymers with blue-emitting fluorene (co)polymers may be contained in a light emitting layer of the device disposed adjacent to another light emitting layer containing one or more fluorene polymers or copolymers such as BP105 or F8-TFB to form an bilayer structure. In these devices, the bilayer structure may be formed by via several different means, as described in PCT/US07/68620. For example, following deposition of the first layer, the bilayer may be insolublized via a thermal treatment alone, or via the inclusion within the first layer of a cross-linkable polymerization agent to link the polymer chains together or form an interpenetrating network. The polymerization may be initiated via UV irradiation or thermal activation. The polymerization processing may be enhanced through the addition of a small amount of an initiator such as IRGACURE® 754, the ESACURE® initiators from Sartomer, BPO, or AIBN. Alternatively, the layer structure may be formed by applying the second layer from a solvent that does not dissolve the first layer, through contact lamination (Ramsdale et al. J. Appl. Phys, vol 92, pg. 4266 (2002)), or through vapor deposition. If desired, these methods maybe applied serially to produce a multilayer structure in which one or more of the layers includes one or more of the polymers of the present invention.

Optoelectronic device according to the present invention may additionally include at least one photoluminescent ("PL") material optically coupled with the polymer such that the phosphor material absorbs a portion of EM radiation emitted thereby and emits EM radiation in a third wavelength range. Materials for use as the PL material and exemplary device structures containing PL materials are described in U.S. Pat. No. 7,063,900, the entire contents of which are incorporated by reference.

An opto-electronic device, exemplified by an organic light emitting device, typically contains multiple layers which include, in the simplest case, an anode layer and a corresponding cathode layer with an organic electroluminescent layer disposed between said anode and said cathode. When a voltage bias is applied across the electrodes, electrons are injected by the cathode into the electroluminescent layer while electrons are removed from (or "holes" are "injected" into) the electroluminescent layer from the anode. Light emission occurs as holes combine with electrons within the electroluminescent layer to form singlet or triplet excitons, light emission occurring as singlet excitons transfer energy to the environment by radiative decay. Triplet excitons, unlike singlet excitons, typically cannot undergo radiative decay and hence do not emit light except at very low temperatures. Theoretical considerations dictate that triplet excitons are formed about three times as often as singlet excitons. Thus the formation of triplet excitons, represents a fundamental limitation on efficiency in organic light emitting devices which are typically operated at or near ambient temperature. Polymers according to the present invention may serve as precursors to light emissive, short-lived excited state species which form as the normally unproductive triplet excitons encounter and that transfer energy.

Other components which may be present in an organic light-emitting device in addition to the anode, cathode and light emitting material include hole injection layers, electron injection layers, and electron transport layers. During operation of an organic light-emitting device comprising an electron transport layer, the majority of charge carriers (i.e. holes and electrons) present in the electron transport layer are electrons and light emission can occur through recombination of holes and electrons present in the electron transport layer. Additional components which may be present in an organic light-emitting device include hole transport layers, hole transporting emission (emitting) layers, hole blocking layers and electron transporting emission (emitting) layers.

The organic electroluminescent layer is a layer within an organic light emitting device which when in operation contains a significant concentration of both electrons and holes and provides sites for exciton formation and light emission. A hole injection layer is a layer usually in contact with the anode which promotes the injection of holes from the anode into the interior layers of the OLED; and an electron injection layer is a layer usually in contact with the cathode that promotes the injection of electrons from the cathode into the OLED. Neither the hole injection layer nor the electron transport layer need not be in contact with the cathode. Frequently the electron transport layer is not an efficient hole transporter and thus it serves to block holes migrating toward the cathode. An electron transport layer is a layer which facilitates conduction of electrons from cathode to a charge recombination site. A hole transport layer is a layer which when the OLED is in operation facilitates conduction of holes from the anode to charge recombination sites and which need not be in contact with the anode. A hole transporting emission layer is a layer in which when the OLED is in operation facilitates the conduction of holes to charge recombination sites, and in which the majority of charge carriers are holes, and in which emission occurs not only through recombination with residual electrons, but also through the transfer of energy from a charge recombination zone elsewhere in the device. A electron transporting emission layer is a layer in which when the OLED is in operation facilitates the conduction of electrons to charge recombination sites, and in which the majority of charge carriers are electrons, and in which emission occurs not only through recombination with residual holes, but also through the transfer of energy from a charge recombination zone elsewhere in the device.

Materials suitable for use as the anode include materials having a bulk conductivity of at least about 100 ohms per square, as measured by a four-point probe technique. Indium tin oxide (ITO) is frequently used as the anode because it is substantially transparent to light transmission and thus facilitates the escape of light emitted from electro-active organic layer. Other materials which may be utilized as the anode layer include tin oxide, indium oxide, zinc oxide, indium zinc oxide, zinc indium tin oxide, antimony oxide, and mixtures thereof.

Materials suitable for use as the cathode include zero valent metals which can inject negative charge carriers (electrons) into the inner layer(s) of the OLED. Various zero valent metals suitable for use as the cathode include K, Li, Na, Cs, Mg, Ca, Sr, Ba, Al, Ag, Au, In, Sn, Zn, Zr, Sc, Y, elements of the lanthanide series, alloys thereof, and mixtures thereof. Suitable alloy materials for use as the cathode layer include Ag—Mg, Al—Li, In—Mg, Al—Ca, and Al—Au alloys. Layered non-alloy structures may also be employed in the cathode, such as a thin layer of a metal such as calcium, or a metal fluoride, such as LiF, covered by a thicker layer of a zero valent metal, such as aluminum or silver. In particular, the cathode may be composed of a single zero valent metal, and especially of aluminum metal.

Materials suitable for use in hole injection layers include 3,4-ethylenedioxythiophene (PEDOT) and blends of PEDOT with polystyrene sulfonate (PSS), commercially available from H.C. Stark, Inc. under the BAYTRON® tradename, and polymers based on a thieno[3,4b]thiophene (TT) monomer, commercially available from Air Products Corporation.

Materials suitable for use in hole transporting layers include 1,1-bis((di-4-tolylamino) phenyl)cyclohexane, N,N'-bis(4-methylphenyl)-N,N'-bis(4-ethylphenyl)-(1,1'-(3,3'-dimethyl)biphenyl)-4,4'-diamine, tetrakis-(3-methylphenyl)-N,N N',N'-2,5-phenylenediamine, phenyl-4-N,N-diphenylaminostyrene, p-(diethylamino) benzaldehyde diphenylhydrazone, triphenylamine, 1-phenyl-3-(p-(diethylamino)styryl)-5-(p-(diethylamino)phenyl)pyrazoline, 1,2-trans-bis(9H-carbazol-9-yl)cyclobutane, N,N,N',N'-tetrakis (4-methylphenyl)-(1,1'-biphenyl)-4,4'-diamine, copper phthalocyanine, polyvinylcarbazole, (phenylmethyl)polysilane; poly(3,4-ethylene dioxythiophene) (PEDOT), polyaniline, polyvinylcarbazole, triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371.

Materials suitable for use as the electron transport layer include poly(9,9-dioctyl fluorene), tris(8-hydroxyquinolato) aluminum (Alq$_3$), 2,9-dimethyl-4,7-diphenyl-1,1-phenanthroline, 4,7-diphenyl-1,10-phenanthroline, 2-(4-biphenylyl)-5-(4-t-butyl phenyl)-1,3,4-oxadiazole, 3-(4-biphenylyl)-4-phenyl-5-(4-t-butylphenyl)-1,2,4-triazole, 1,3,4-oxadiazole-containing polymers, 1,3,4-triazole-containing polymers, quinoxaline-containing polymers, and cyano-PPV.

DEFINITIONS

In the context of the present invention, alkyl is intended to include linear, branched, or cyclic hydrocarbon structures and combinations thereof, including lower alkyl and higher alkyl. Preferred alkyl groups are those of C$_{20}$ or below. Lower alkyl refers to alkyl groups of from 1 to 6 carbon atoms, preferably from 1 to 4 carbon atoms, and includes methyl, ethyl, n-propyl, isopropyl, and n-, s- and t-butyl. Higher alkyl refers to alkyl groups having seven or more carbon atoms, preferably 7-20 carbon atoms, and includes n-, s- and t-heptyl, octyl, and dodecyl. Cycloalkyl is a subset of alkyl and includes cyclic hydrocarbon groups of from 3 to 8 carbon atoms. Examples of cycloalkyl groups include cyclopropyl, cyclobutyl, cyclopentyl, and norbornyl. Alkenyl and alkynyl refer to alkyl groups wherein two or more hydrogen atoms are replaced by a double or triple bond, respectively.

Aryl and heteroaryl mean a 5- or 6-membered aromatic or heteroaromatic ring containing 0-3 heteroatoms selected from nitrogen, oxygen or sulfur; a bicyclic 9- or 10-membered aromatic or heteroaromatic ring system containing 0-3 heteroatoms selected from nitrogen, oxygen or sulfur; or a tricyclic 13- or 14-membered aromatic or heteroaromatic ring system containing 0-3 heteroatoms selected from nitrogen, oxygen or sulfur. The aromatic 6- to 14-membered carbocyclic rings include, for example, benzene, naphthalene, indane, tetralin, and fluorene; and the 5- to 10-membered aromatic heterocyclic rings include, e.g., imidazole, pyridine, indole, thiophene, benzopyranone, thiazole, furan, benzimidazole, quinoline, isoquinoline, quinoxaline, pyrimidine, pyrazine, tetrazole and pyrazole.

Arylalkyl means an alkyl residue attached to an aryl ring. Examples are benzyl and phenethyl. Heteroarylalkyl means an alkyl residue attached to a heteroaryl ring. Examples include pyridinylmethyl and pyrimidinylethyl. Alkylaryl means an aryl residue having one or more alkyl groups attached thereto. Examples are tolyl and mesityl.

Alkoxy or alkoxyl refers to groups of from 1 to 8 carbon atoms of a straight, branched, cyclic configuration and combinations thereof attached to the parent structure through an oxygen. Examples include methoxy, ethoxy, propoxy, isopropoxy, cyclopropyloxy, and cyclohexyloxy. Lower alkoxy refers to groups containing one to four carbons.

Acyl refers to groups of from 1 to 8 carbon atoms of a straight, branched, cyclic configuration, saturated, unsaturated and aromatic and combinations thereof, attached to the parent structure through a carbonyl functionality. One or more carbons in the acyl residue may be replaced by nitrogen, oxygen or sulfur as long as the point of attachment to the parent remains at the carbonyl. Examples include acetyl, benzoyl, propionyl, isobutyryl, t-butoxycarbonyl, and benzyloxycarbonyl. Lower-acyl refers to groups containing one to four carbons.

Heterocycle means a cycloalkyl or aryl residue in which one to two of the carbons is replaced by a heteroatom such as oxygen, nitrogen or sulfur. Examples of heterocycles that fall within the scope of the invention include pyrrolidine, pyrazole, pyrrole, indole, quinoline, isoquinoline, tetrahydroisoquinoline, benzofuran, benzodioxan, benzodioxole (commonly referred to as methylenedioxyphenyl, when occurring as a substituent), tetrazole, morpholine, thiazole, pyridine, pyridazine, pyrimidine, thiophene, furan, oxazole, oxazoline, isoxazole, dioxane, and tetrahydrofuran.

Substituted refers to residues, including, but not limited to, alkyl, alkylaryl, aryl, arylalkyl, and heteroaryl, wherein up to three H atoms of the residue are replaced with lower alkyl, substituted alkyl, aryl, substituted aryl, haloalkyl, alkoxy, carbonyl, carboxy, carboxalkoxy, carboxamido, acyloxy, amidino, nitro, halo, hydroxy, $OCH(COOH)_2$, cyano, primary amino, secondary amino, acylamino, alkylthio, sulfoxide, sulfone, phenyl, benzyl, phenoxy, benzyloxy, heteroaryl, or heteroaryloxy.

Haloalkyl refers to an alkyl residue, wherein one or more H atoms are replaced by halogen atoms; the term haloalkyl includes perhaloalkyl. Examples of haloalkyl groups that fall within the scope of the invention include $CH_2F$, $CHF_2$, and $CF_3$.

Many of the compounds described herein may contain one or more asymmetric centers and may thus give rise to enantiomers, diastereomers, and other stereoisomeric forms that may be defined, in terms of absolute stereochemistry, as (R)— or (S)—. The present invention is meant to include all such possible isomers, as well as, their racemic and optically pure forms. Optically active (R)— and (S)— isomers may be prepared using chiral synthons or chiral reagents, or resolved using conventional techniques. When the compounds described herein contain olefinic double bonds or other centers of geometric asymmetry, and unless specified otherwise, it is intended that the compounds include both E and Z geometric isomers. Likewise, all tautomeric forms are also intended to be included.

Oxaalkyl refers to an alkyl residue in which one or more carbons have been replaced by oxygen. It is attached to the parent structure through an alkyl residue. Examples include methoxypropoxy, 3,6,9-trioxadecyl and the like. The term oxaalkyl refers to compounds in which the oxygen is bonded via a single bond to its adjacent atoms (forming ether bonds); it does not refer to doubly bonded oxygen, as would be found in carbonyl groups. Similarly, thiaalkyl and azaalkyl refer to alkyl residues in which one or more carbons has been replaced by sulfur or nitrogen, respectively. Examples include ethylaminoethyl and methylthiopropyl.

Silyl means an alkyl residue in which one to three of the carbons is replaced by tetravalent silicon and which is attached to the parent structure through a silicon atom. Siloxy is an alkoxy residue in which both of the carbons are replaced by tetravalent silicon that is endcapped with an alkyl residue, aryl residue or a cycloalkyl residue, and which is attached to the parent structure through an oxygen atom.

A bidentate ligand is a ligand that is capable of binding to metals through two sites. Similarly, a tridentate ligand is a ligand that is capable of binding to metals through three sites. Cyclometallated ligand means a bidentate or tridentate ligand bound to a metal atom by a carbon-metal single bond and one or two metal-heteroatom bonds, forming a cyclic structure, wherein the heteroatom may be N, S, P, As, or O.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

EXAMPLES

General Procedure for Preparation of Monomers

A preferred synthetic route for preparing the 2,7-dibromofluorenone starting material is described in CN 1634839 (Scheme 1). The procedure uses bromine in water and results in high conversion of fluorenone to the desired dibromo product with little to no formation of mono-brominated species and unknown side-products are virtually absent. These underbrominated and unknown products are typically present in substantially higher quantities when fluorenone is brominated using a method that employs N-bromosuccinimde in methanesulfonic acid.

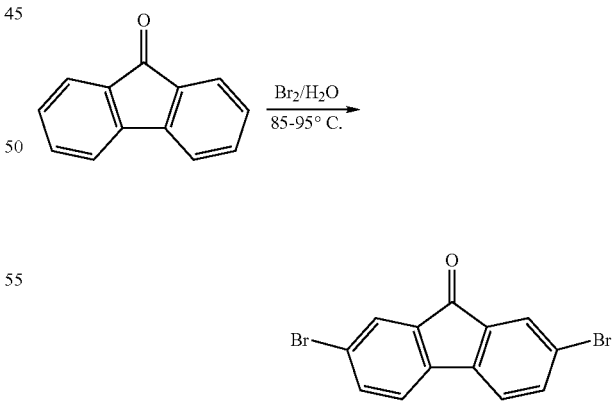

After three crystallizations of a scaled-up reaction, 150 g of high quality 2,7-dibromofluorenone (>99.8% purity, LC analysis) ready to be used in subsequent reactions was obtained. A portion of the 2,7-dibromofluorenone was converted into tosylated ethylene glycol 9,9'-disubstituted fluorene (5) in four steps (Scheme 2).

Scheme 2

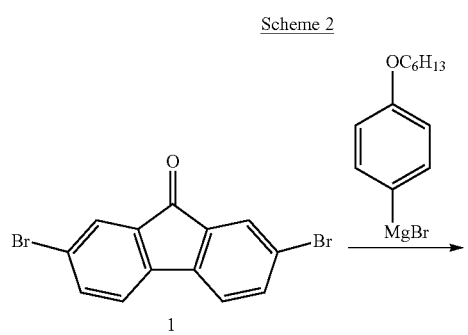

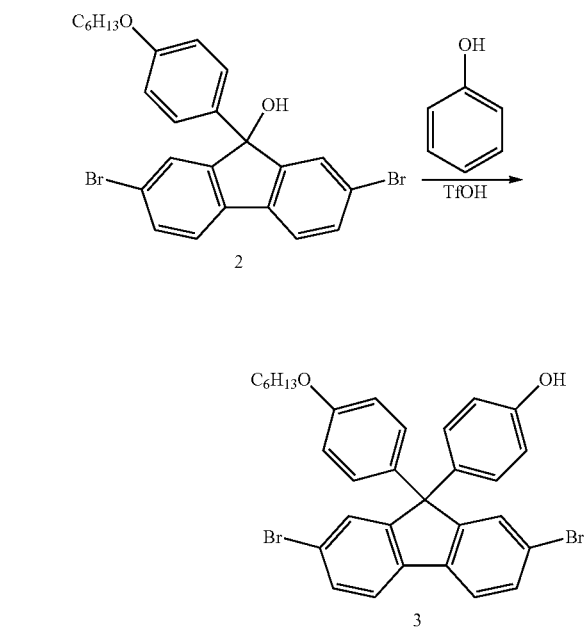

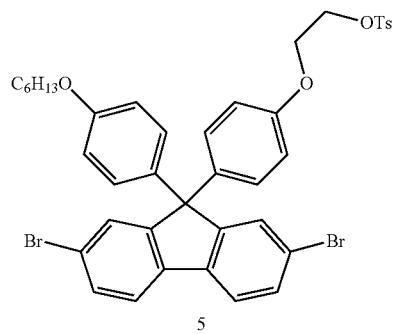

The synthetic method described JP 1997255609 for glycosylation was employed with a slight modification, affording the desired fluorene 4 in high conversion (95%) at substantially shorter reaction times (12 hours) and under neutral conditions. The tosylated fluorene (5) was used to prepare monomers (Scheme 3) for incorporation into polyfluorene materials having pendant benzoylpyrrolic Ir(III) phosphors covalently attached on the periphery. Benzoylpyrrolic Ir(III) phosphors are covalently attached to fluorene monomers (6) by displacing the tosyl-substituent with a phenolic nucleophile.

Scheme 3

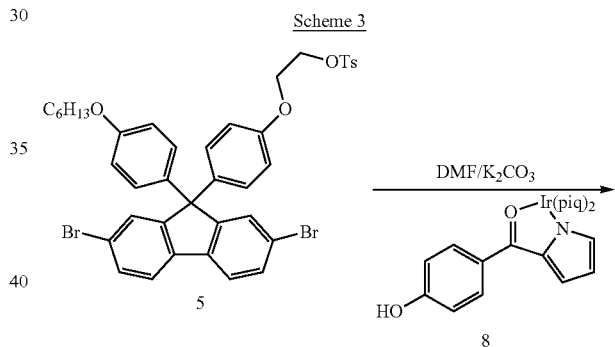

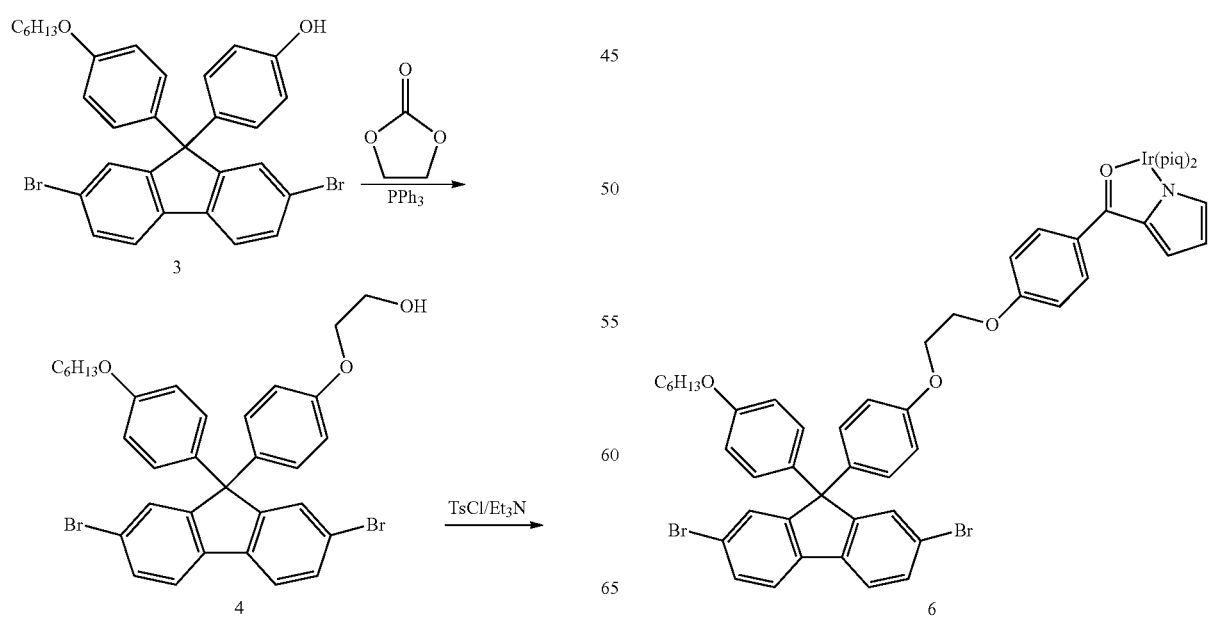

-continued
Scheme 4

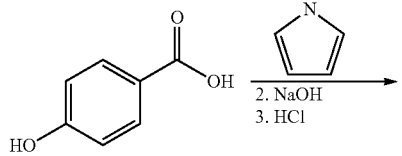

1. TFAA/H₃PO₄
   CH₃CN

2. NaOH
3. HCl

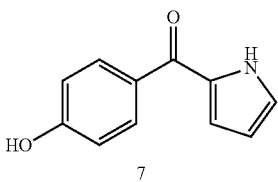

7

Example 1

Synthesis of 9-(4-Hexyloxyphenyl)-9H-fluoren-9-ol (2)

Bromo-(4-hexyloxy)-benzene was prepared by alkylation of 4-bromophenol (91.2 g, 527 mmol) with bromohexane (86.0 g, 520 mmol), $K_2CO_3$ (80.0 g, 580 mmol) in acetone (200 mL) at reflux for 12 h. After removal of the salts by filtration, the reaction mixture was concentrated to dryness to give an oil. The oil was dissolved in EtOAc (100 mL) and transferred to a separatory funnel and washed with 5% NaOH (4×200 mL). An additional 200 mL volume of EtOAc was added to the separatory funnel and the contents were washed with $NaHCO_3$ (1×200 mL) and finally dried over $MgSO_4$. Removal of the EtOAc solvents afforded a light yellow oil and was used without further purification. Yield: 119 g, 89%. $^1$H NMR (500 MHz, $CD_2Cl_2$, 25° C.) δ 0.91 (t, 3H), 1.34 (m, 4H), 1.45 (m, 2H), 1.76 (m, 2H), 3.92 (t, 2H), 6.79 (d, 2H), 7.36 (d, 2H). A dry 250 mL three-neck flask was charged with small Mg turnings (2.80 g, 118 mmol) followed by anhydrous THF (100 mL). A few iodine crystals were added and the heterogeneous mixture was heated at reflux for 15 min and then cooled to room temperature. Stirring was stopped and 1,2-diromoethane (0.25 mL) was added to the reaction vessel. After five minutes had elapsed, an exothermic reaction ensued and stirring was resumed for 20 min. The reaction was then cooled to 20° C. and bromo-(4-hexyloxy)-benzene (27.8 g, 108 mmol) was added over a period of an hour while keeping the temperature between 14-18° C. The cooling bath was removed and the reaction was stirred for an additional 10 min as the temperature of the reaction rose to 28° C. The reaction was cooled to room temperature and the contents were transferred by pipette to a stirred toluene (250 mL) suspension of 2,7,-dibromofluorenone (30.0 g, 90.4 mmol) that was maintained at −10° C. with a cooling bath. The cooling bath was removed and the reaction mixture was stirred at room temperature for 20 min and subsequently treated with 20 mL of EtOH and a saturated solution of $NH_4Cl$ (5 mL). The reaction mixture was filtered to remove insoluble materials and transferred to a separatory funnel containing EtOAc (100 mL) and $H_2O$ (100 mL). The layers were separated and the organic layer was washed with $H_2O$ (2×100 mL), and brine (1×100 mL), and dried over $MgSO_4$. The solvents were removed to dryness to give a crude yellow solid (50.8 g). The crude material was recrystallized from hexanes/$CH_2Cl_2$ to afforded the product as an off-white microcrystalline material. Yield: 38.6 g, 79%. $^1$H NMR (500 MHz, $CD_2Cl_2$, 25° C.) δ 0.91 (t, 3H), 1.32 (m, 4H), 1.41 (m, 2H), 1.74 (m, 2H), 2.66 (s, 1H), 3.92 (t, 2H), 6.79 (d, 2H), 7.23 (d, 2H), 7.43 (d, 2H), 7.52 (m, 4H).

Example 2

Synthesis of 9-(4-Hexyloxyphenyl)-9'-(4-hydroxyphenyl)-fluorene (3)

A $CH_2Cl_2$ (75 mL) solution of phenol (24 g, 256 mmol) and 9-(4-hexyloxyphenyl)-9H-Fluoren-9-ol (2) (30.0 g, 55.7 mmol) was treated with 20 drops of methanesulfonic acid which caused the solution to change to purple in color. The reaction was stirred at room temperature until TLC analysis indicated that the starting fluorenol was consumed. The reaction mixture was transferred to a separatory funnel and washed with a saturated solution of $NaHCO_3$ (1×200 mL), $H_2O$ (3×150 mL), and then the organic layer was dried over $MgSO_4$. The solvents were removed to dryness to give an oil. The oil was adsorbed onto silica gel from a $CH_2Cl_2$ solution and the solvents were removed to dryness. The dried silica gel was transferred to a glass fritted funnel (500 mL) containing a packed $H_2O$ slurry of silica gel (200 mL) fitted on a vacuum flask. The contents of the funnel were flushed with $H_2O$ by applying vacuum to the flask which eluted phenol from the silica gel. After excess phenol was removed, the product was eluted from the silica gel with $CH_3CN$. The solvents were removed using a rotary evaporator with a bath at 45° C. which resulted in the formation of a milky solution from which a white solid formed. The product was collected by filtration, washed with water and dried. Isolated as a mixture (90:10) of para- and ortho- isomers of the hydroxyphenol adduct. Yield: 34.0 g, 98%. $^1$H NMR (500 MHz, $CD_2Cl_2$, 25° C.) δ0.89 (t, 3H), 1.32 (m, 4H), 1.43 (m, 2H), 1.74 (m, 2H), 3.91 (t, 2H), 4.90 (s, 1H), 6.72 (d, 2H), 6.77 (d, 2H), 7.01 (d, 2H), 7.04 (d, 2H), 7.47 (d, 2H), 7.50 (d, 2H), 7.63 (d, 2H).

Example 3

Synthesis of 9-(4-Hexyloxyphenyl)-9'-(4-(2-hydroxyethoxy)phenyl)-fluorene (4)

The phenol 3 (33.0 g, 53.7 mmol) was dissolved in xylenes (30 mL), dried over $MgSO_4$, and filtered. The solution was concentrated on a rotary evaporator until the contents of the flask weighed 70 g. The xylenes solution of 3 was then placed under an inert atmosphere of $N_2$ and treated with ethylene carbonate (3.9 mL, 59.0 mmol) which was then heated at reflux for 15 h. After this time had passed, the reaction was cooled to room temperature and the solvents were removed to give a yellow oil. The oil was chromatographed through 2 L of $SiO_2$ and eluted with $CH_2Cl_2$. The product was isolated as a colorless oil after removal of the solvents. Yield 29.1 g, 82%. $^1$H NMR (500 MHz, $CD_2Cl_2$, 25° C.) δ0.94 (t, 3H), 1.36 (m, 4H), 1.47 (m, 2H), 1.78 (m, 2H), 2.03 (t, 1H), 3.94 (m, 4H), 4.07 (t, 2H), 6.81 (d, 2H), 6.85 (d, 2H), 7.08 (d, 2H), 7.11 (d, 2H), 7.52 (d, 2H), 7.54 (d, 2H), 7.67 (d, 2H).

Example 4

Synthesis of 9-(4-Hexyloxyphenyl)-9'-(4-(2-p-toluenesulfonylethoxy)phenyl)-fluorene (5)

A toluene solution (200 mL) of the ethylene glycol 4 (29.1 g, 44.2 mmol) was treated with p-toluenesulfonyl chloride (13.3 g, 69.8 mmol) and triethyamine (19.4 mL, 140 mmol) and stirred at room temperature for 60 hours under an inert atmosphere of $N_2$. The reaction mixture was then filtered to remove triethylamine hydrochloride and concentrated to dryness. The residue was dissolved in EtOAc and washed with 5% HCl (1×100 mL), saturated $NaHCO_3$ (2×200 mL), dried over $MgSO_4$, and the solvents were removed to dryness. The crude oil was chromatographed through 1.4 L of $SiO_2$ ($CH_2Cl_2$:Hexanes, 1:1). The product was isolated as a white amorphous solid after removal of the solvents. Yield 33.0 g, 92%. $^1$H NMR (500 MHz, $CD_2Cl_2$, 25° C.) δ0.88 (t, 3H), 1.33 (m, 4H), 1.43 (m, 2H), 1.74 (m, 2H), 2.41 (s, 3H), 3.91 (t, 2H), 4.09 (t, 2H), 4.31 (t, 2H), 6.68 (d, 2H), 6.77 (d, 2H), 7.03 (m, 4H), 7.34 (d, 2H), 7.46 (d, 2H), 7.50 (d, 2H), 7.63 (d, 2H), 7.78 (d, 2H).

Example 5

Synthesis of [(piq)$_2$Ir(7)]-fluorene Monomer (6)

To a stirred DMF solution (25 mL) containing the tosylated fluorene 5 (3.00 g, 4.00 mmol) and the benzoylpyrrole iridium complex 7 (3.00 g, 3.8 mmol) was added solid $K_2CO_3$ (1.00 g, 7.24 mmol). After letting this solution stir at 80° C. for 1.5 h, the reaction was cooled and $H_2O$ (75 mL) was added and the red precipitate that formed was sonicated and collected by filtration, washed with water, MeOH, and then dried in air. The product was chromatographed through $SiO_2$:Toluene and isolated as a red solid after removal of the solvents. Yield 5.00 g, 92%. $^1$H NMR (500 MHz, $CD_2Cl_2$, 25° C.) δ0.89 (t, 3H), 1.33 (m, 4H), 1.42 (m, 2H), 1.73 (m, 2H), 3.90 (t, 2H), 4.27 (m, 2H), 4.34 (m, 2H), 6.30 (dd, 1H), 6.41 (dd, 1H), 6.45 (dd, 1H), 6.51 (t, 1H), 6.77 (m, 6H), 7.00 (m, 8H), 7.19 (dd, 1H), 7.32 (d, 1H), 7.43 (d, 1H), 7.47 (d, 2H), 7.50 (dd, 2H), 7.53 (d, 1H), 7.62 (d, 2H), 7.73 (m, 4H), 7.87 (m, 1H), 7.92 (m, 1H), 7.96 (d, 2H), 8.27 (d, 2H), 8.34 (d, 1H), 8.99 (m, 2H).

Example 6

Synthesis of 2-(4-Hydroxybenzoyl)-pyrrole (7)

To a stirred suspension of 4-hydroxybenzoic acid (5.50 g, 40.0 mmol) in $CH_3CN$ cooled to 0° C. was added trifluoroacetic anhydride (10 mL, 72.0 mmol). After 15 minutes had passed, the benzoic acid dissolved. To this cooled solution at 0° C. was added 1-(p-tolylsulfonyl)pyrrole (8.85 g, 40.0 mmol) followed by enough $CH_2Cl_2$ to dissolve the pyrrole at this temperature. An additional volume of trifluoroacetic anhydride (10 mL, 72.0 mmol) was added to the reaction mixture followed by $H_3PO_4$ (2 mL, 37.0 mmol) with rapid stirring. After the reaction mixture was stirred at room temperature for 12 h, additional trifluoroacetic anhydride (6 mL, 43.2 mmol) and 4-hydroxybenzoic acid (4.00 g, 29.0 mmol) were added and stirring was continued for 12 hours. After this time had passed the solvents were removed to dryness and the residue was suspended in 5% NaOH (250 mL) and stirred overnight. The suspension was removed by filtration and the filter cake was washed with 5% NaOH (250 mL). To the filtrate was added a saturated solution of $NaHCO_3$ (200 mL) and the pH of the solution was rendered neutral by adding concentrated HCl. A pink microcrystalline material formed and was collected by filtration, washed with water and dried. Yield 3.30 g, 44%. $^1$H NMR (500 MHz, $CD_2Cl_2$, 25° C.) δ6.35 (m, 1H), 6.90 (m, 1H), 6.94 (d, 2H), 7.14 (m, 1H), 7.87 (d, 2H), 9.70 (bs, 1H).

Example 7

Synthesis of [(piq)$_2$Ir(7)](8)

To a stirred and chilled (−10° C.) EtOH solution (100 mL) containing the ketopyrrole 7 (1.20 g, 6.40 mmol) was added solid sodium hydride (288 mg, 12.0 mmol) which caused the solution to turn from yellow to orange in color. After letting this solution stir for 5 min, [(piq)$_2$Ir(μ—Cl)]$_2$ (3.33 g, 2.56 mmol) was added and the mixture was then heated at reflux for 10 hours. The reaction mixture was cooled to room temperature and the red precipitate was collected by filtration. The product was washed with EtOH and dried in air. Yield (3.85 mg, 96%). $^1$H NMR (500 MHz, $CD_2Cl_2$, 25° C.) δ6.32 (dd, 1H), 6.42 (dd, 2H), 6.45 (dd, 1H), 6.51 (t, 1H), 6.73 (m, 1H), 6.78 (m, 1H), 6.83 (d, 2H), 7.00 (m, 2H), 7.18 (dd, 1H), 7.31 (d, 1H), 7.43 (d, 1H), 7.53 (d, 1H), 7.73 (m, 4H), 7.89 (m, 4H), 8.27 (m, 2H), 8.34 (d, 1H), 8.99 (m, 2H).

Example 8

Preparation of 9,9-Dioctylfluorene-Triarylamine Copolymer

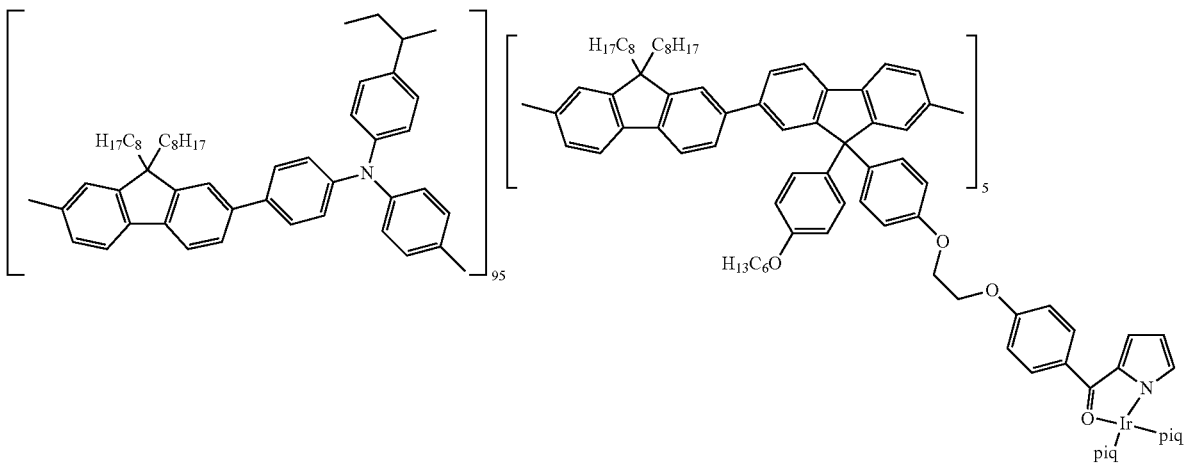

| Compound | MW | mmol | Mg | Notes |
|---|---|---|---|---|
| F8-bis borate | 530 | 1.00 | 530 | |
| TFB dibromide | 459 | 0.95 | 436 | |
| Iridium complex | 1405 | 0.05 | 70 | |
| Pd(OAc)$_2$ | 224 | 0.031 | 7 | 0.75% of functional groups |
| Tri-o-tolylphosphine | 304 | 0.105 | 32 | 3.5 × [Pd] |
| Et$_4$NOH | 147 | 5.0 | 3.7 g | 20% aq solution |
| Water | | | 3.7 g | |
| Toluene | | | 20 ml | |

All monomers were dried at 50° C. in a vacuum oven for at least two hours prior to weighing. A 50 ml 2-neck flask with a nitrogen inlet to a bubbler and a magnetic stirrer was charged with all the monomers, tri-o-tolylphosphine and 15-18 ml of the toluene. This solution was degassed with argon for 5-10 minutes then Pd(OAc)$_2$ was added using the remaining toluene to wash the weighing funnel. Simultaneously in a separate vial, the aqueous components were degassed with argon. After at least 15 minutes of degassing, the aqueous components were added to the organic solution and the flask was immersed in a 70° C. oil bath. Stirring and heating under a positive nitrogen pressure were continued for 16-20 hours at which point the solution was allowed to reach room temperature and phenylboric acid, 20 mg was added. The flask was again immersed in the heating bath and stirred under nitrogen for an additional 3 hrs. The mixture was allowed to cool again and was then diluted with about 10 ml each of toluene and water. The mixture was transferred to a separatory funnel, the aqueous phase was discarded and the organic phase was washed with 3×50 ml water and 1×50 ml of saturated NaCl. The organic solution was then passed through a funnel containing Celite and Drierite and the filtered solution was stirred for at least 30 minutes with amine-functional silica gel. The solution was again filtered and concentrated to a volume of 20-30 ml on a rotary evaporator then loaded on to a toluene saturated silica gel cartridge (20-30 g silica/gm polymer—note 6). The polymer was eluted from the column with toluene (~100 ml) and the toluene solution was concentrated to ~20 ml. The polymer was isolated by precipitating the solution into 10 volumes of methanol with vigorous stirring. The polymer was collected by filtration, washed with methanol and dried in a 40-50° C. vacuum oven. Yield after drying was 403 mg (55%). Gel permeation chromatography indicated Mw 92.4K, Mn 23.0K relative to polystyrene standards.

Example 9

Device Fabrication

A layer of PEDOT/PSS (Baytron P VP 8000, a poly(3,4-ethylenedioxy thiophene)-poly(styrenesulfonate) obtained as a solution from HC Starck, Inc.) having a thickness of about 60 nm was deposited by spin-coating onto clean, UV-ozone treated, 2.5 cm×2.5 cm ITO patterned glass substrates. The coated substrates were then baked on a hot plate in air for 30 minutes at 160° C. A layer of F8-TFB (an octylfluorene-triarylamine copolymer obtained from Sumation, Inc.) hole transporting layer having a thickness of about 10-20 nm was then spin-coated atop the PEDOT/PSS coated substrates. The F8-TFB-PEDOT/PSS coated substrates were then baked on a hot plate in argon for 30 minutes at 170° C. A final layer of a 1:1 blend of an electroluminescent polymer, BP104 (Sumation), and the polymer of Example 8 was deposited via spin casting from a xylene solution atop the F8-TFB layer. This layer had a thickness of approximately 40-50 nm). The coated substrates were then placed into a bell jar evaporator, and the system was pumped until a pressure of about 1×10$^{-6}$ torr was obtained. A layer of sodium fluoride about 3 nm thick (as measured via a calibrated quartz crystal microbalance) was then deposited atop the final layer of the coated substrates by physical vapor deposition. Subsequently, a layer of aluminum metal about 130 nm thick was deposited atop the sodium fluoride layer by vapor deposition under vacuum to form the cathode component of the OLED.

For each of the devices, brightness and current versus applied voltage were measured using a Keithley 236 Source Measure unit and a silicon diode coupled to a picoammeter (Keithley). The current response of the diode was converted to OLED brightness (cd/m$^2$) through calibration of the silicon diode against a Minolta LS 100 Luminance meter and by measuring the active area of the OLED. Brightness ("cd/A") measures how efficiently injected charge is converted to light the eye can see, and the LPW is a power efficacy metric (how much visible light is generated for a certain amount of input power). The LPW data includes the effect of both the operating voltage and the charge to visible light conversion efficiency. The combination of the Cd/A and LPW data indicate relatively efficient operation of the device that includes the polymer material, and that this material is compatible with low voltage operation of the device The color of light emitted (EL spectrum) by each OLED device sample was measured using a calibrated spectrometer while operating the device over a range of from about 390 nm to about 750 nm at a current density of about 1 mA. Both blue emission form the BP 104 material and red emission from the red emissive polymer material were produced. The emission from this particular device was dominated by the red emissive species, indicating that the performance shown in the LPW and Cd/A graphs is indicative of the performance of the side arm emissive polymers.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:
1. An optoelectronic device comprising a polymer having at least one pendant group of formula

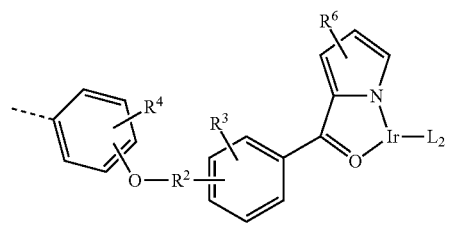

wherein

R$^2$ is alkylene, substituted alkylene, oxaalkylene, CO, or CO$_2$;

R$^3$, R$^4$ and R$^6$ are independently hydrogen, alkyl, alkoxy, alkylaryl, aryl, arylalkyl, heteroaryl, substituted alkyl; substituted alkoxy, substituted alkylaryl, substituted aryl, substituted arylalkyl, or substituted heteroaryl;

L is derived from phenylpyridine, tolylpyridine, benzothienylpyridine, phenylisoquinoline, dibenzoquinozaline, fluorenylpyridine, ketopyrrole, 2-(1-naphthyl)benzoxazole)), 2-phenylbenzoxazole, 2-phenylbenzothiazole, coumarin, thienylpyridine, phenylpyridine, benzothienylpyridine, 3-methoxy-2-phenylpyridine, thienylpyridine, phenylimine, vinylpyridine, pyridylnaphthalene, pyridylpyrrole, pyridylimidazole, phenylindole, derivatives thereof or combinations thereof.

2. An optoelectronic device according to claim 1, wherein the polymer additionally comprises structural units derived from at least one fluorene monomer.

3. An optoelectronic device according to claim 1, wherein the polymer additionally comprises structural units derived from a dibromo 9,9-dioctyl fluorene monomer.

4. An optoelectronic device according to claim 1, wherein the polymer additionally comprises structural units derived from at least one triarylamine monomer.

5. An optoelectronic device according to claim 1, wherein L is derived from phenylisoquinoline.

6. An optoelectronic device according to claim 1, wherein $R^2$ is oxaalkylene.

7. An optoelectronic device according to claim 1, wherein the pendant group is

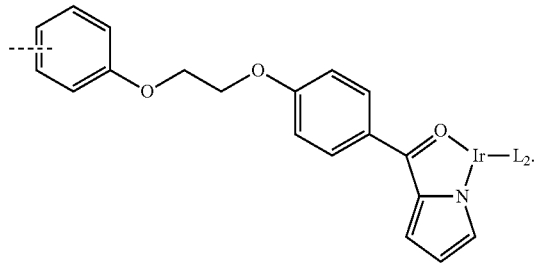

8. An optoelectronic device according to claim 1, wherein the pendant group is

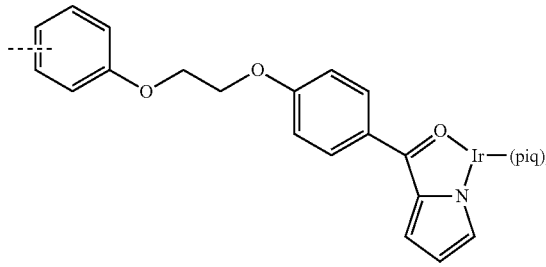

wherein piq is phenylisoquinolinyl.

9. An optoelectronic device according to claim 1, wherein the pendant group is derived from a compound of formula

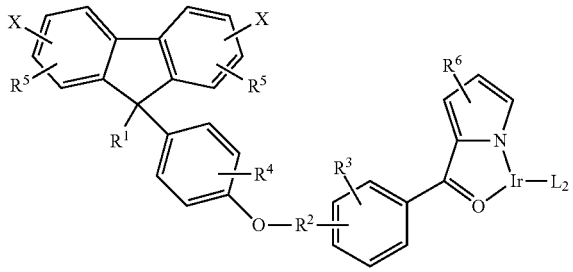

wherein $R^1$, $R^3$, $R^4$ and $R^6$ are independently hydrogen, alkyl, alkoxy, oxaalkyl, alkylaryl, aryl, arylalkyl, heteroaryl, substituted alkyl; substituted alkoxy, substituted oxaalkyl, substituted alkylaryl, substituted aryl, substituted arylalkyl, or substituted heteroaryl;

$R^{1a}$ is hydrogen or alkyl;

$R^2$ is alkylene, substituted alkylene, oxaalkylene, CO, or $CO_2$;

$R^{2a}$ is alkylene;

$R^5$ is independently at each occurrence hydrogen, alkyl, alkylaryl, aryl, arylalkyl, alkoxy, carboxy, substituted alkyl; substituted alkylaryl, substituted aryl, substituted arylalkyl, or substituted alkoxy, X is halo, triflate, $—B(OR^{1a})_2$, or

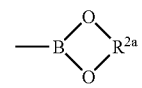

located at the 2, 5- or 2, 7-positions; and

L is derived from phenylpyridine, tolylpyridine, benzothienylpyridine, phenylisoquinoline, dibenzoquinozaline, fluorenylpyridine, ketopyrrole, 2-(1-naphthyl)benzoxazole)), 2-phenylbenzoxazole, 2-phenylbenzothiazole, coumarin, thienylpyridine, phenylpyridine, benzothienylpyridine, 3-methoxy-2-phenylpyridine, thienylpyridine, phenylimine, vinylpyridine, pyridylnaphthalene, pyridylpyrrole, pyridylimidazole, phenylindole, derivatives thereof or combinations thereof.

10. An optoelectronic device according to claim 1, wherein the pendant group is derived from a compound selected from

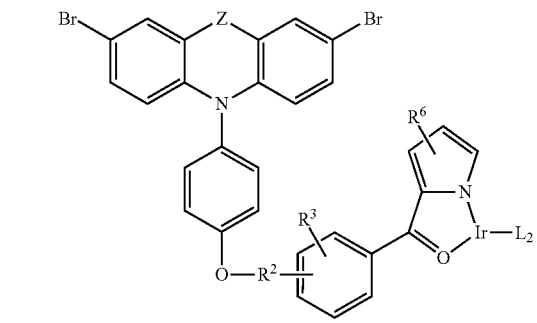

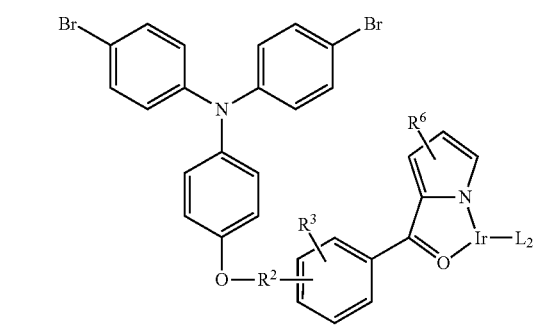

-continued

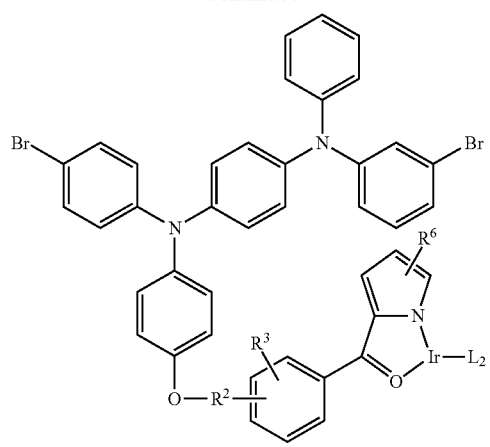

wherein Z is O, S, or a direct bond.

11. An optoelectronic device according to claim 1, comprising structural units of formula

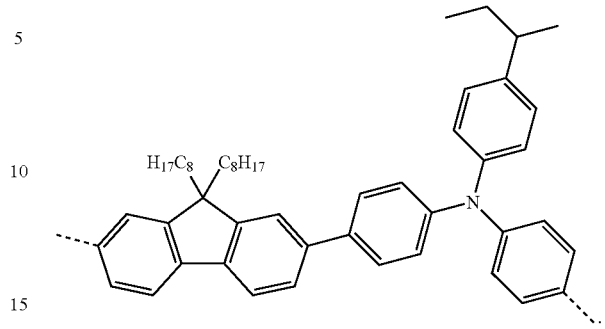

12. An optoelectronic device according to claim 1, comprising structural units of formula

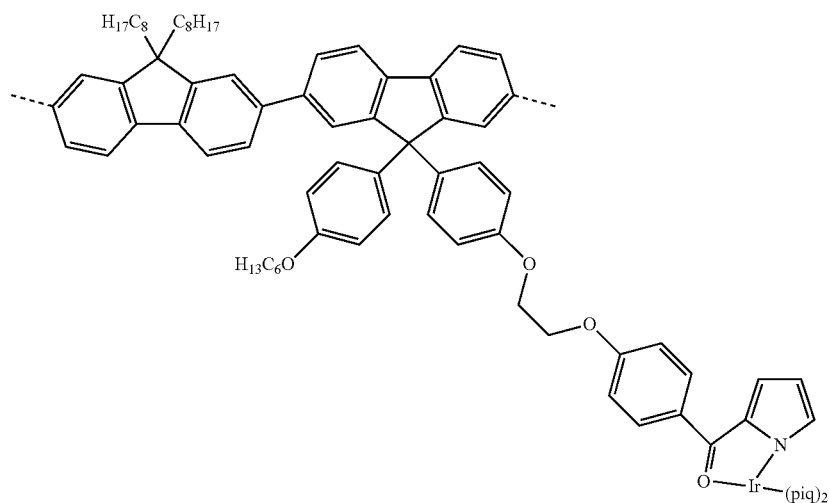

wherein piq is phenylsoquinolinyl.

13. An optoelectronic device according to claim 1, comprising structural units of formula

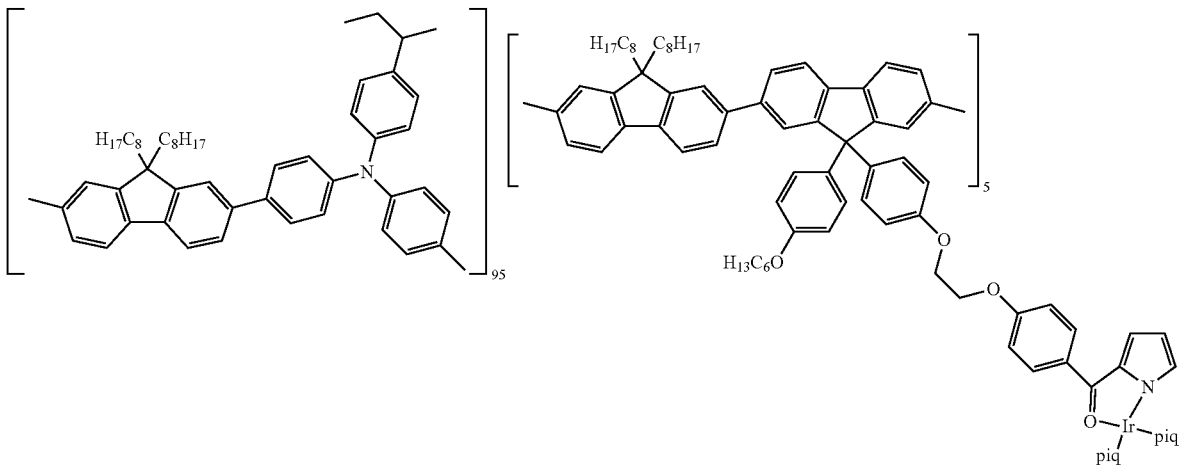

wherein piq is phenylsoquinolinyl.

14. An optoelectronic device according to claim 1, additionally comprising a fluorescent emitting material.

15. An optoelectronic device according to claim 14, wherein the fluorescent material is a blue emitting polymer.

16. An optoelectronic device according to claim 14, where the fluorescent emitting material comprises a polymer having structural units derived from a fluorene monomer.

17. An optoelectronic device according to claim 1, additionally comprising at least one photoluminescent ("PL") material optically coupled with the polymer such that the phosphor material absorbs a portion of EM radiation emitted thereby and emits EM radiation in a third wavelength range.

* * * * *